United States Patent
Qian et al.

(10) Patent No.: US 12,557,302 B2
(45) Date of Patent: Feb. 17, 2026

(54) MULTIPLE STATE PROGRAMMABLE MEMORY

(71) Applicant: TEXAS INSTRUMENTS INCORPORATED, Dallas, TX (US)

(72) Inventors: Jack Qian, Plano, TX (US); Kemal Tamer San, Plano, TX (US); Guruvayurappan S Mathur, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 387 days.

(21) Appl. No.: 18/228,338

(22) Filed: Jul. 31, 2023

(65) Prior Publication Data
US 2025/0048656 A1    Feb. 6, 2025

(51) Int. Cl.
*H10B 20/20* (2023.01)
*H10B 99/00* (2023.01)

(52) U.S. Cl.
CPC ............. *H10B 99/14* (2023.02); *H10B 20/20* (2023.02)

(58) Field of Classification Search
CPC ........... H10B 99/14; H10B 20/20; H10D 1/47
See application file for complete search history.

(56) References Cited

U.S. PATENT DOCUMENTS 5,872,381 A * 2/1999 Kato .................... H10D 86/201
257/E27.047

\* cited by examiner

*Primary Examiner* — David Vu
(74) *Attorney, Agent, or Firm* — Andrew R. Ralston; Frank D. Cimino

(57) ABSTRACT

Described examples include an integrated circuit having a plurality of nominally identical polycrystalline silicon resistors over a semiconductor substrate. Each of the polysilicon resistors has a resistor body with a first end and a second end, wherein the first end is connected to a current source and the second end is connected to a resistance discriminator. A first proper subset of the resistors have a first resistance, and a second first proper subset of the resistors have a difference second resistance.

18 Claims, 12 Drawing Sheets

MULTIPLE STATE PROGRAMMABLE MEMORY

TECHNICAL FIELD

This relates generally to memory devices, and more particularly to programmable read-only memory.

BACKGROUND

Semiconductor memory design is an endless quest to put more memory capacity in less semiconductor area. Most memory cells store one of two states at a time. These states represent a "1" or a "0" in binary math. Thus, the memory using this type of cell needs one cell for each binary digit stored. With memories having capacities of megabytes or gigabytes, the space occupied by each of those cells adds up rapidly. The space considerations are even more pronounced with programmable read-only memories. These types of memories often include a fuse mechanism for each cell. One memory state is defined by the fuse being opened by "blowing" the fuse and the other state is defined by leaving the fuse intact, and thus conductive. Blowing a fuse may require a current high enough to cause collateral damage to the circuit or generate residue that requires additional cleaning steps. This requires space to avoid damaging nearby components when programming. In addition, once blown, a fuse may become reconnected over time by material migration. This can cause an error while the memory device is used in the field that requires replacement of the memory.

SUMMARY

In accordance with an example, an integrated circuit includes a plurality of nominally identical polycrystalline silicon resistors over a semiconductor substrate. Each of the polysilicon resistors has a resistor body with a first end and a second end, wherein the first end is connected to a current source and the second end is connected to a resistance discriminator. A first proper subset of the resistors have a first resistance, and a second first proper subset of the resistors have a difference second resistance.

BRIEF DESCRIPTION OF THE DRAWINGS

FIGS. 2A-5A and 2B-5B are plan views and side views, respectively, showing an example process for forming the structure of FIGS. 1A and 1B.

DETAILED DESCRIPTION

Figure 1A:
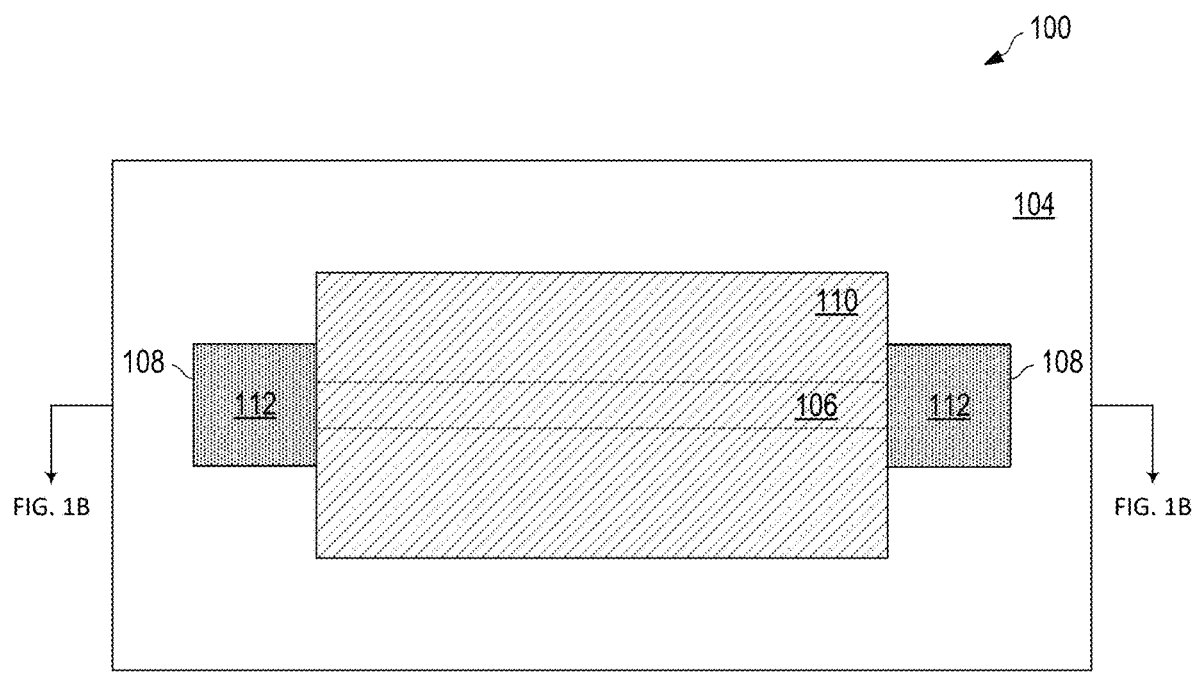
FIGS. 1A and 1B are a plan view and side view, respectively, of an example programmable read-only memory cell.

In the drawings, corresponding numerals and symbols generally refer to corresponding parts unless otherwise indicated. The drawings are not necessarily drawn to scale. In this description, the term "coupled" may include connections made with intervening elements, and additional elements and various connections may exist between any elements that are "coupled." Also, as used herein, the terms "on" and "over" may include layers or other elements where intervening or additional elements are between an element and the element that it is "on" or "over."

Figure 1B:
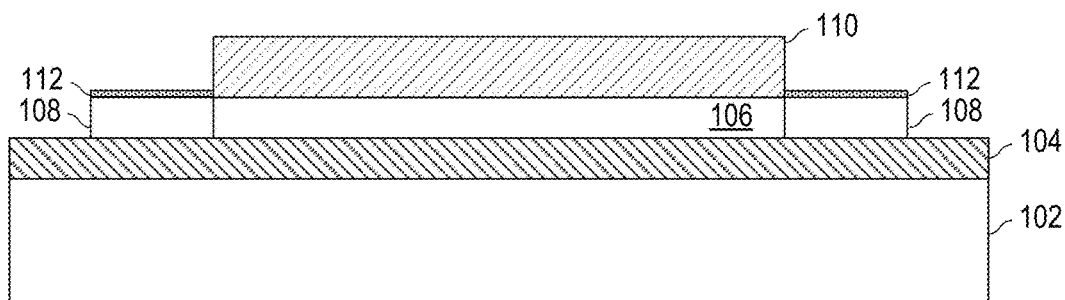

FIGS. 1A and 1B are a plan view and side view, respectively, of an example programmable read-only memory cell 100. Insulating layer 104 is formed over substrate 102. In an example, insulating layer 104 is a layer of silicon dioxide. Polycrystalline silicon resistor 106 and contact points 108 are formed from a patterned layer of polycrystalline silicon, where polycrystalline silicon resistor 106 provides a resistive body, whose resistance may be programmed. In this example, the length of polycrystalline silicon resistor 106 (the distance between contact points 108) is greater than the width (perpendicular to the length) of polycrystalline silicon resistor 106. Silicidation barrier 110 is formed on polycrystalline silicon resistor 106. Silicide layers 112 are formed on contact points 108 to provide high conductivity. Silicidation barrier 110 prevents silicidation of polycrystalline silicon resistor 106.

Figure 2A:
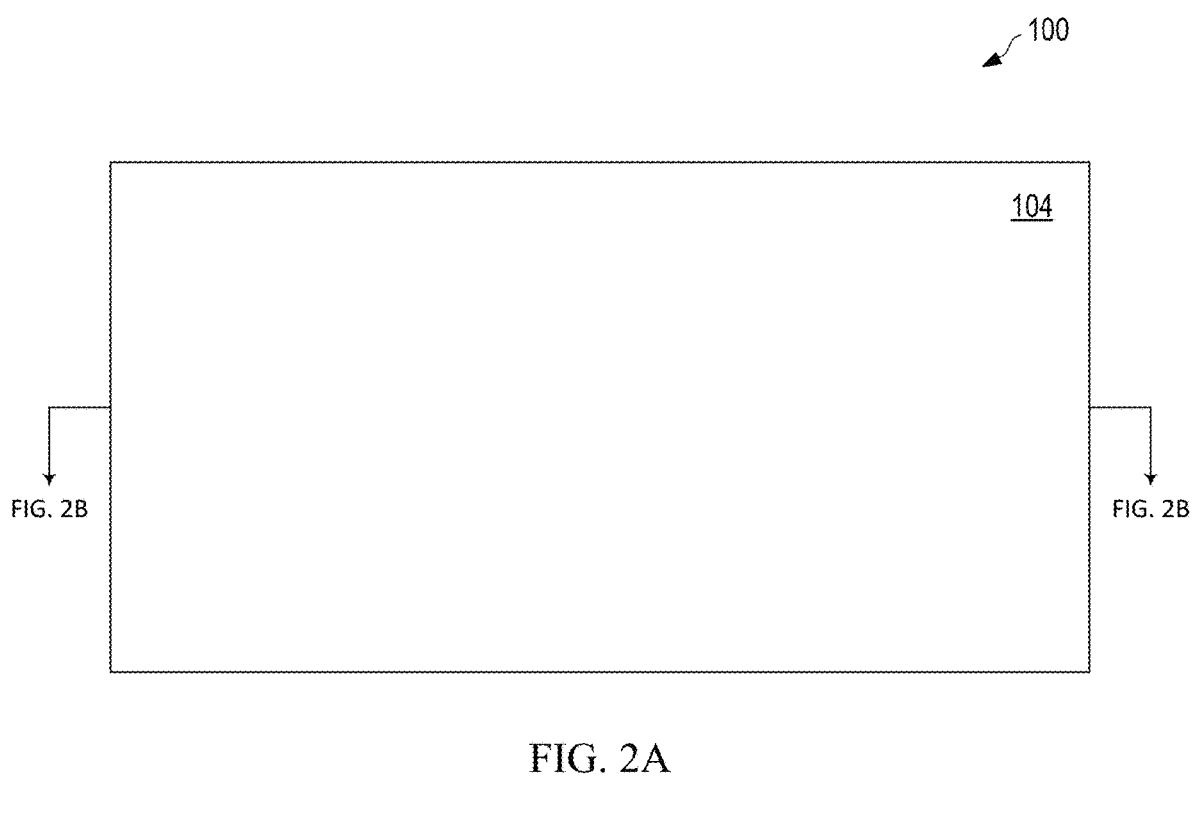
Figure 2B:
Figure 3A:
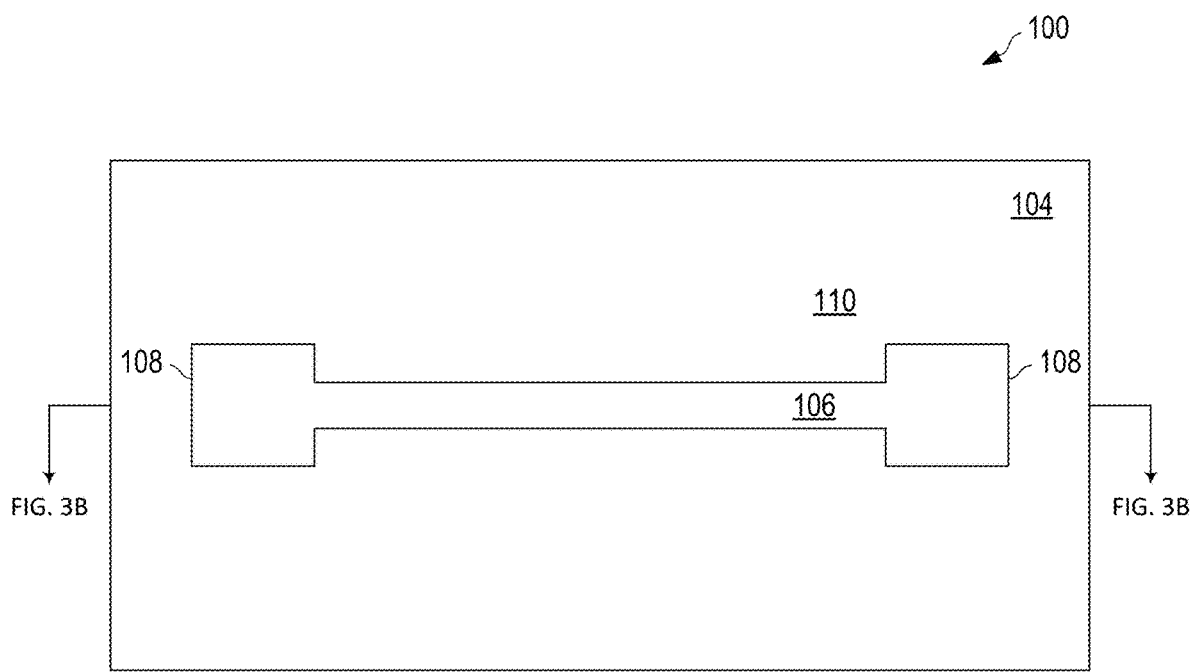
Figure 3B:
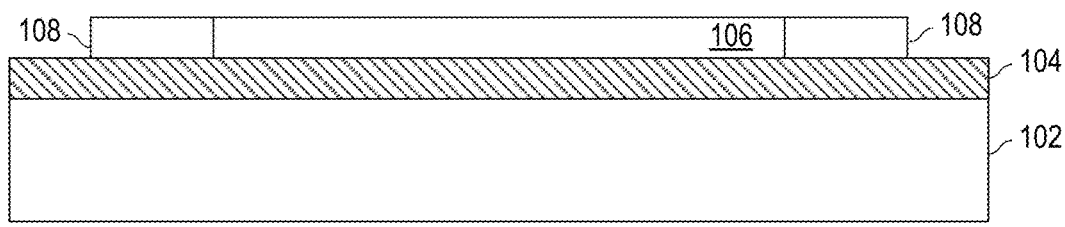

FIGS. 2A-5A and 2B-5B are plan views and side views, respectively, showing an example process for forming the structure of FIGS. 1A and 1B. FIGS. 2A and 2B show an insulating layer 104 formed on a silicon semiconductor substrate 102. In one example, insulating layer 104 is a silicon dioxide layer formed by chemical vapor deposition (CVD) of tetraethyl orthosilicate to a thickness of approximately 50 nm. In other examples insulating layer 104 may be a thermal oxide. FIGS. 3A and 3B show a patterned layer of polycrystalline silicon including polycrystalline silicon resistor 106 and contact points 108. A layer of polycrystalline silicon is deposited on insulating layer 104 using CVD of silane to a thickness of 120 nm, with a range of 110 nm to 130 nm. In a non-limiting example, the polycrystalline silicon is formed in a tube furnace with a temperature of about 600° C., a pressure of 200 mT, and a silane flow rate of about 0.2 slm (standard liters per minute). The deposited polycrystalline silicon layer is doped to a dopant concentration of about $1\times10^{20}$ cm$^{-3}$ (with a range from about $1\times10^{18}$ cm$^{-3}$ to about $1\times10^{21}$ cm$^{-3}$) using in situ dopant or implantation after deposition. The polycrystalline silicon layer is then patterned using a photolithographic mask and etching to provide polycrystalline silicon body as polycrystalline silicon resistor 106 and contact points 108.

Figure 4A:
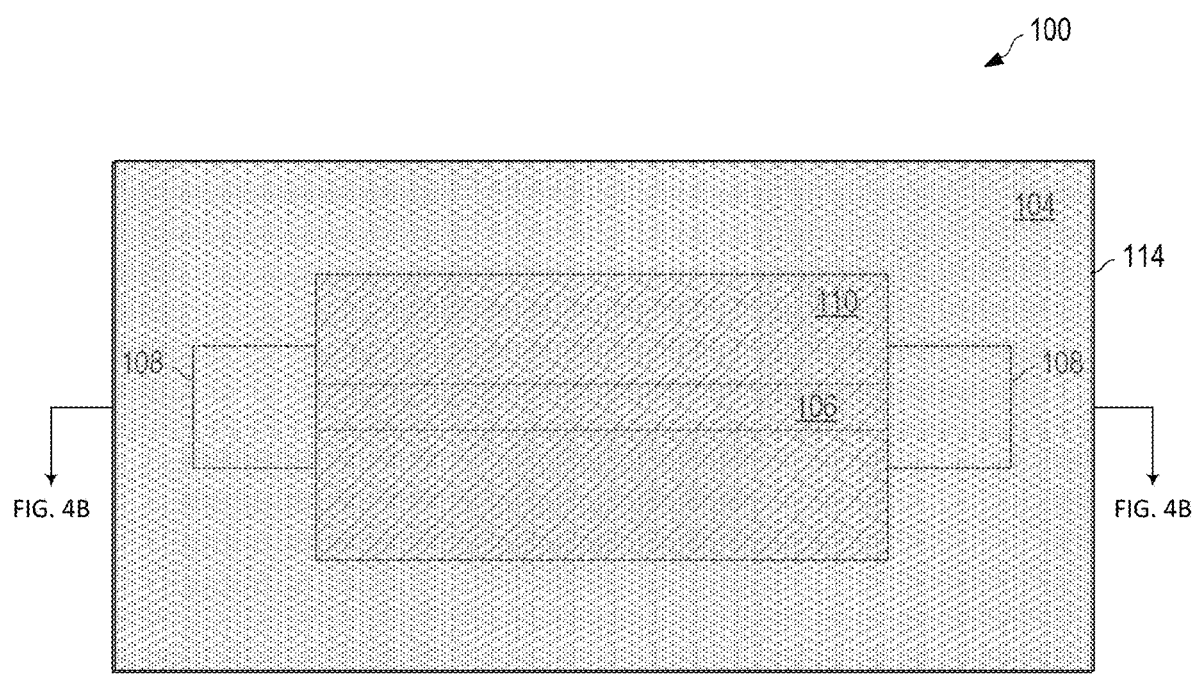
Figure 4B:
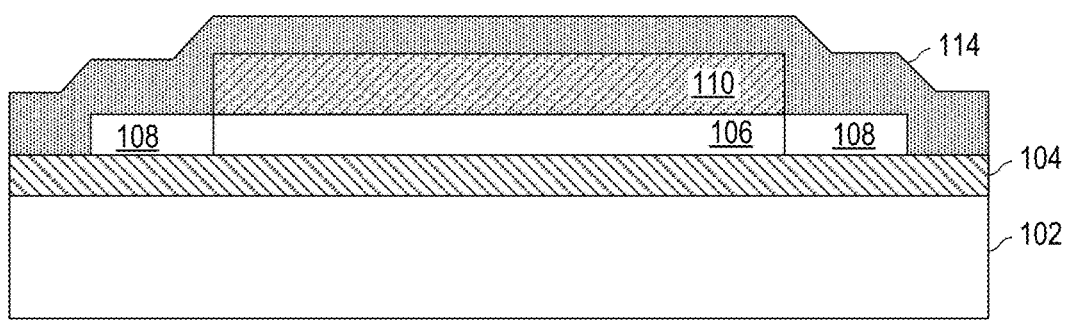
Figure 5A:
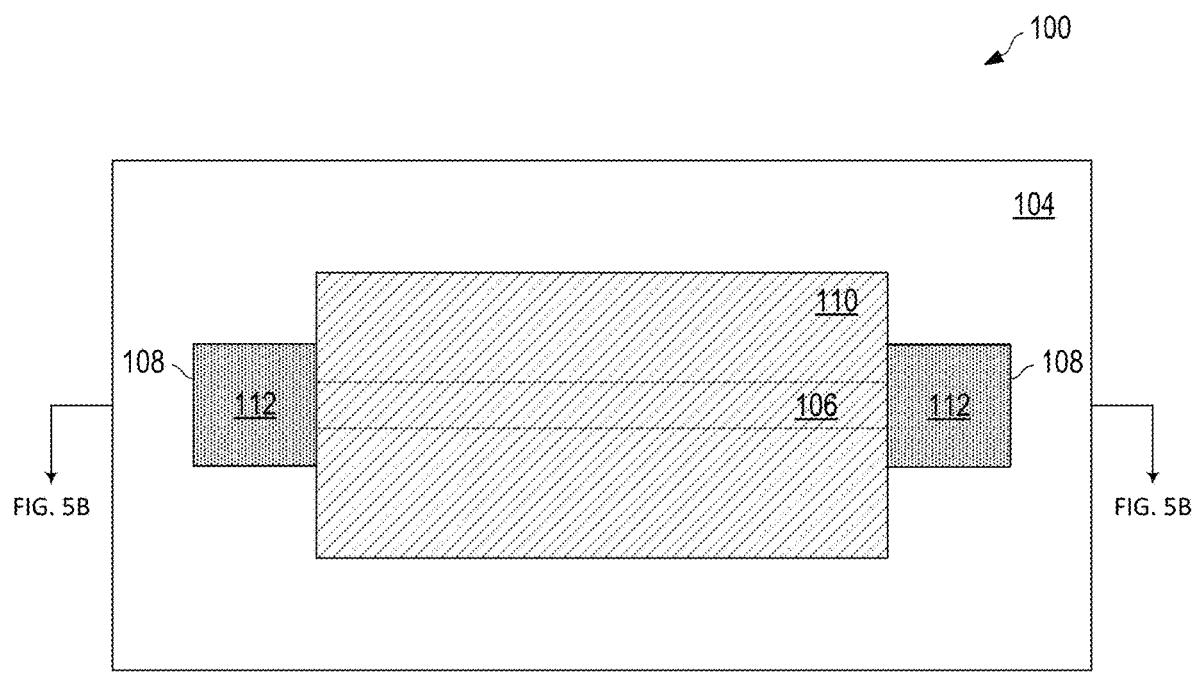
Figure 5B:
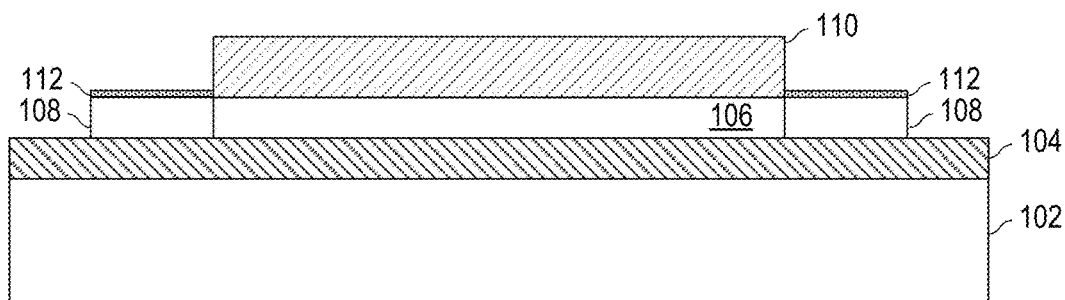

FIGS. 4A and 4B show a silicidation barrier 110 formed on polycrystalline silicon resistor 106. In this example, silicidation barrier 110 is formed using CVD of silane and ammonia to a thickness of 5 nm, with a range of 2 nm to 50 nm. The resulting silicon nitride layer is then patterned using photolithography and etching. In this example, silicon nitride is used as the silicidation barrier because it can be differentially etched relative to insulating layer 104, which is silicon dioxide. A siliciding metal 114 is then deposited using sputtering. Examples of siliciding metals are titanium, molybdenum, cobalt and tungsten. The siliciding metal 114 is then annealed to react with the exposed portions of contact points 108. This forms silicide layers 112 as shown in FIGS. 5A and 5B. Silicide will also form on the sides of contact points 108, but this is omitted from the drawings for clarity.

Figure 6:
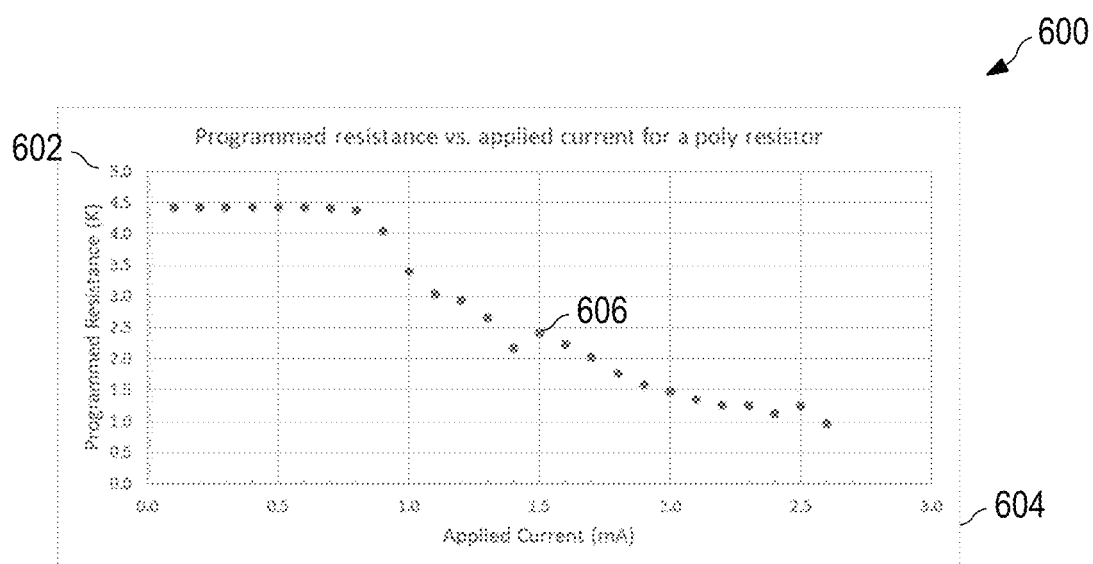
FIG. 6 is a graph showing the resulting resistance of an example polycrystalline silicon resistor after application of different currents through the example polycrystalline silicon resistor.

FIG. 6 is a graph showing the resulting resistance of an example polycrystalline silicon resistor after application of different currents through the example polycrystalline silicon resistor. Graph 600 shows the resulting resistance on the vertical axis 602 versus the current applied to the resistor on the horizontal axis 604. That is, the current on the horizontal axis is applied to an example resistor and the resulting resistance is measured. A different current is then applied to another example resistor having the same characteristics and the resistance of that resistor is measured. Graph 600 shows samples from 0.1 mA up to 2.6 mA. These currents are less than the current necessary to rupture the polycrystalline silicon resistor. Thus, these non-rupture currents do not cause damage to the polycrystalline silicon resistor. As shown in graph 600 the resistance is unchanged at about 4.5 kΩ up to an applied current of about 0.8 mA. Beyond that current, the resulting resistance is decreasing by an approximately linear amount to about 1 kΩ after the application of 2.6 mA. For example, point 606 shows a resulting resistance of about 2.4 kΩ after the application of 1.5 mA. This shows that the resistance of the resistor can be altered (lowered) by a known delta of resistance to a known programmed resistance by the application of the appropriate current.

Figure 7:
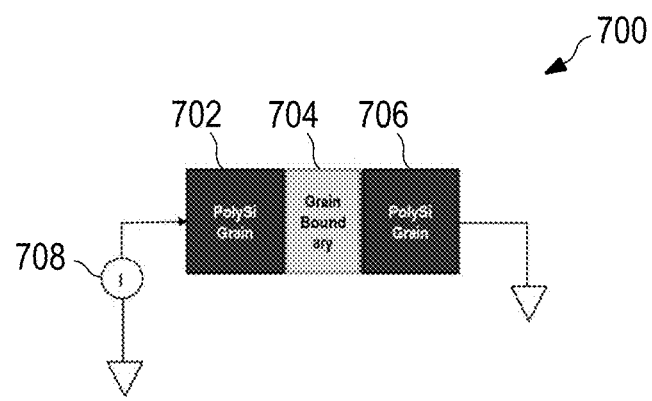
FIG. 7 is a schematic diagram of grains within a polycrystalline silicon resistor.

FIG. 7 is a simplified schematic diagram of grains within a polycrystalline silicon resistor 700. In some examples a polycrystalline silicon resistor may include thousands of grains. It is believed that the application of sufficient current from current source 708 heats the polycrystalline sufficiently to cause growth of larger grains and absorption of smaller grains, thereby reducing the number of brain boundaries in the current path and lowering the resistance of the polycrystalline silicon resistor. Thus, the polycrystalline silicon has an initial grain size distribution with an initial median grain size. After heating by current flow, the polycrystalline silicon has a different grain size distribution with a larger median grain size. The width (in the narrow direction) of the polycrystalline silicon resistor 700 may be a range from about 20 nm to about 60 nm or at least 2.5 or more times the median grain size, e.g. to ensure uniformity of resistivity of the polycrystalline silicon among a plurality of polycrystalline silicon resistors. In addition, it is believed that the heating caused by the current causes migration of dopant to the grain boundaries, thus causing a greater concentration of dopant at the grain boundaries after application of the current, possibly reducing resistance across the grain boundary.

Figure 8:
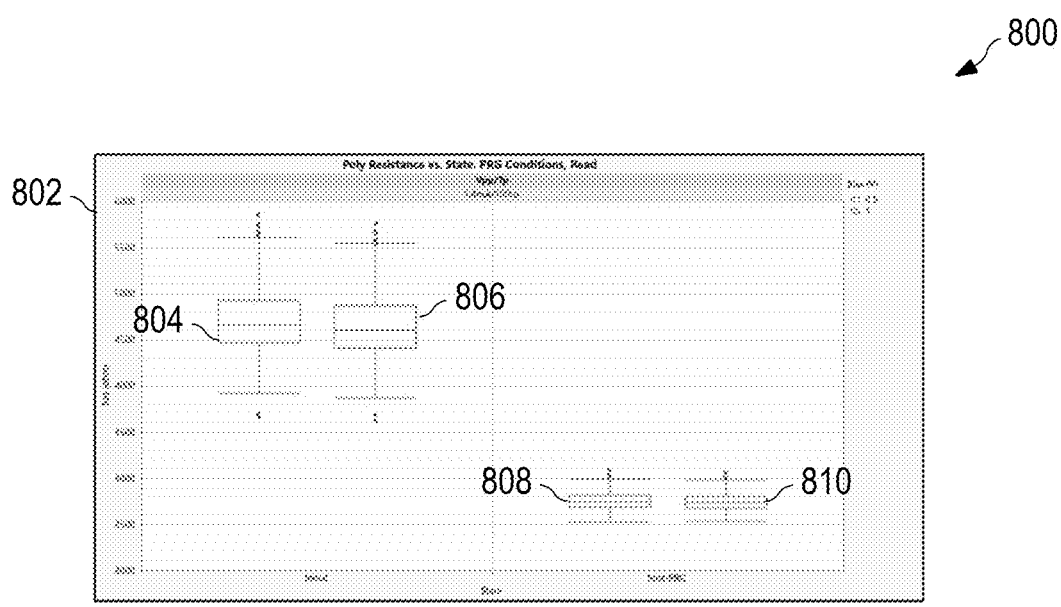
FIG. 8 is a chart including a graph showing statistical data on programming an example polycrystalline silicon resistor.

FIG. 8 is a chart including graph 800 showing statistical data on programming an example polycrystalline silicon resistor. The vertical axis 802 of graph 800 shows resistance value in ohms. Box plot 804 shows the resistance values measured in unprogrammed resistors under 0.5 V bias. The box shows the ±25$^{th}$ percentile. The horizontal lines at the ends of the whiskers show ±75$^{th}$ percentile. The dots above and below the ±75$^{th}$ percentile lines are outlier data points. As can be seen from box plot 804, the median resistance of the unprogrammed resistor is about 4.7 kΩ. Box plot 806 is the measurement of the same resistors using 1 V bias, which provides data confirming the measurements of box plot 804. Box plot 808 shows the measurements under 0.5 V bias for the same resistors as shown in box plot 804 and box plot 806 after application of a current of 1.25 mA to those resistors. As can be seen from box plot 808, the resulting median resistance is about 2.75 kΩ. Box plot 810 is for those same resistors after application of 1.25 mA under 1 V bias. This data shows that consistent and predictable coding of the polycrystalline silicon resistors is practicable.

Figure 9:
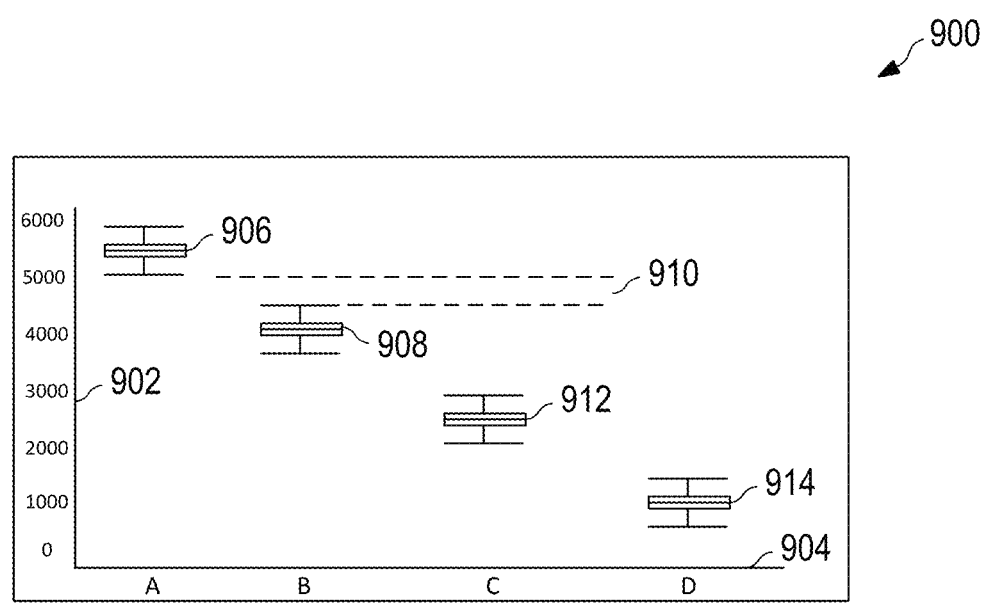
FIG. 9 is a chart showing an example programming regime in a graph.

FIG. 9 is a chart showing an example programming regime in graph 900. Vertical axis 902 is the programmed resistance in ohms. Horizontal axis 904 designates one of four programed states A, B, C, and D. Each box plot of graph 900 shows a resistance range for each of the programed states, which are programed by applying one of four selected currents (including zero for state A) to the polycrystalline silicon resistors. Box plot 906 shows that programming state A is about 5.5 kΩ. In this example, state A is the "unprogrammed" state. That is, no programming current is applied to a polycrystalline silicon resistor for state A. Box plot 908 shows that programed state B is about 4 kΩ, about a 27% reduction. Margin 910 is the margin needed to allow effective discrimination of the programed state, which is measured from the negative 75$^{th}$ percentile of box plot 906 to the positive 75$^{th}$ percentile of box plot 908, in this example. This margin is an example and similar margins are desirable between each of the programed states. Box plot 912 shows that programed state C is about 2.5 kΩ, about a 37% reduction relative to state B. Box plot 914 shows that programed state D is about 1.0 kΩ, about a 60% reduction relative to state C. These examples indicate that a resistance difference of at least 25% between programmed states is achievable and can provide margin for unambiguous distinction between states.

Figure 10:
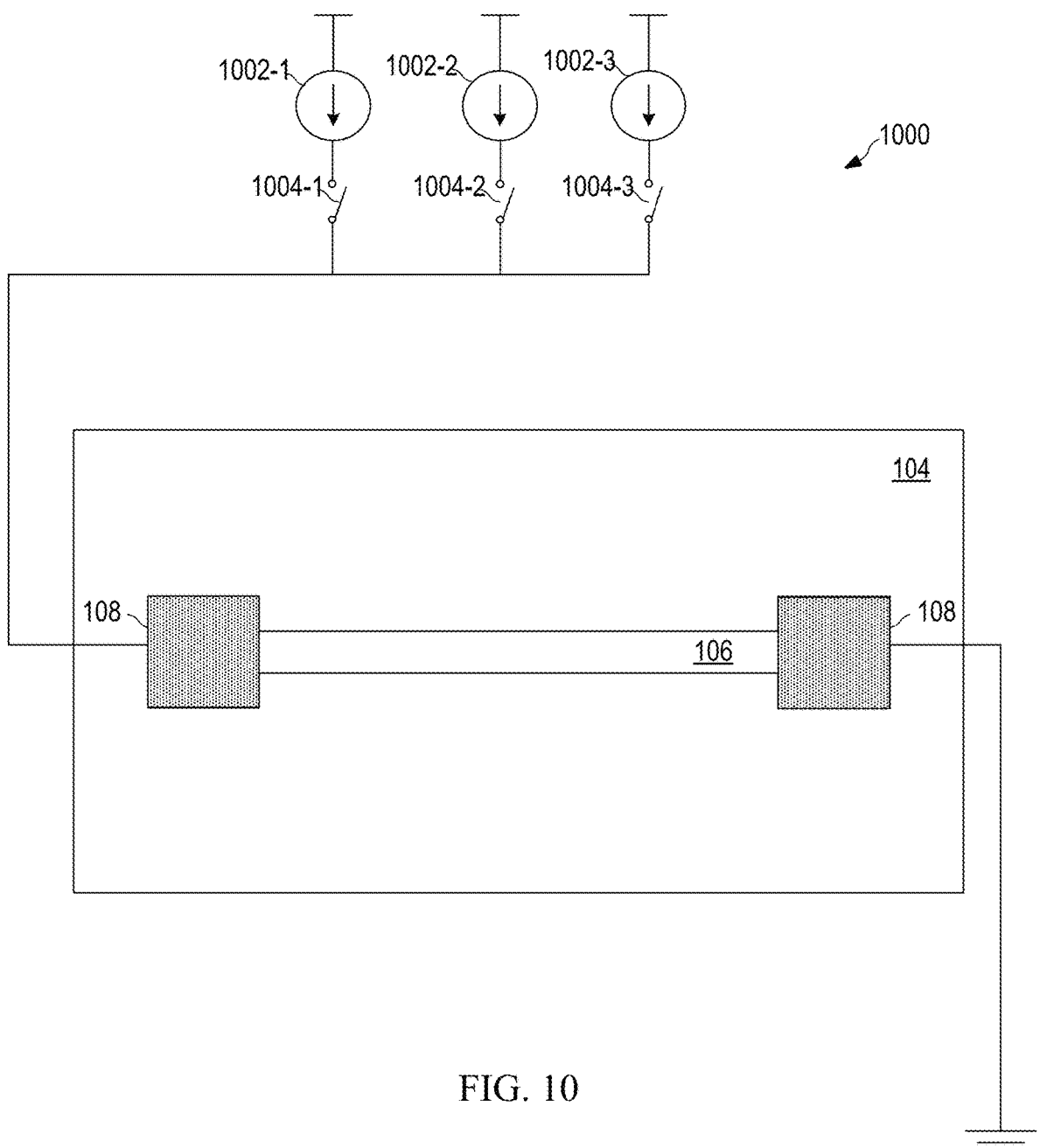
FIG. 10 is a simplified circuit schematic diagram of an example programming circuit.

FIG. 10 is a simplified circuit schematic diagram of an example programming circuit 1000. Current source 1002-1, current source 1002-2, and current source 1002-3 provide different current corresponding to the desired resistance of polycrystalline silicon resistor 106. In this example there are four states including the state where no programming current is applied to polycrystalline silicon resistor 106. Logically, the four states can correspond to binary 00, 01, 10, and 11. Thus, one polycrystalline silicon resistor 106 provides the storage capacity of two bits. In principle a larger number of programmed states is possible, consistent with the ability to discriminate among the different states. Current source 1002-1, current source 1002-2, and current source 1002-3 may be formed on the same substrate 102. However, the current sources may also be external to the integrated circuit on which polycrystalline silicon resistor 106 is formed and coupled to polycrystalline silicon resistor 106 by probes during a programming step in manufacturing or by addressing circuitry after packaging the device containing polycrystalline silicon resistor 106. In FIG. 10, switch 1004-1, switch 1004-2, and switch 1004-3 are shown as a mechanism for selectively coupling current source 1002-1, current source 1002-2, and current source 1002-3, respectively, to polycrystalline silicon resistor 106. However, any mechanism for selective coupling the desired current source for programming may be effectively employed.

Figure 11:
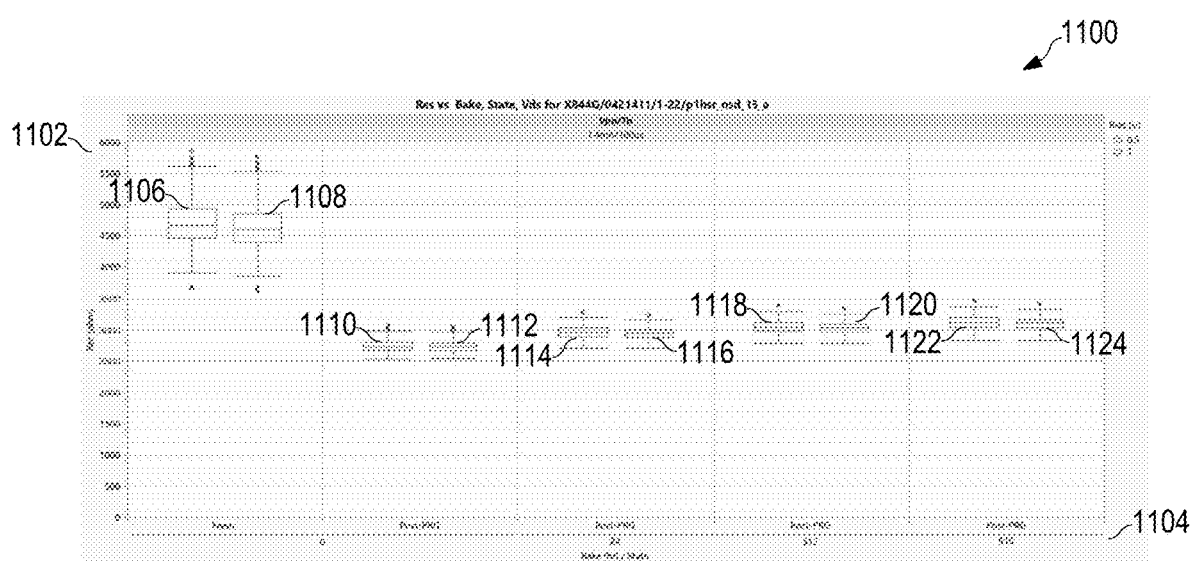
FIG. 11 is a graph showing the stability of programming the polycrystalline silicon resistor.

FIG. 11 is a graph 1100 showing the stability of programming the polycrystalline silicon resistor. Vertical axis 1102 is the resistance measured in ohms. Horizontal axis 1104 is the time in hours that the programmed resistors were baked at 250° C. for zero (immediately after programming), 24 hours, 312 hours, and 816 hours. Box plot 1106 is the data for the unprogrammed resistors under 0.5 V bias. Box plot 1108 is the data for the unprogrammed resistors under 1 V bias. Box plot 1110 and box plot 1112 are immediately after programming to approximately 2.75 kΩ at 0.5 V and 1 V bias, respectively. Box plot 1114 and box plot 1116 are 24 hours after baking at 250° C. after programming with a bias of 0.5 V and 1 V, respectively. Box plot 1118 and box plot 1120 are 312 hours after baking at 250° C. after programming at a bias of 0.5 V and 1 V, respectively. Box plot 1122 and box plot 1124 are 816 hours after programming to approximately 2.75 kΩ at a bias of 0.5 V and 1 V, respectively. Baking for 800 hours is approximately analogous to 10 years of operation at normal operating temperatures. This shows that the programming is very stable.

Figure 12:
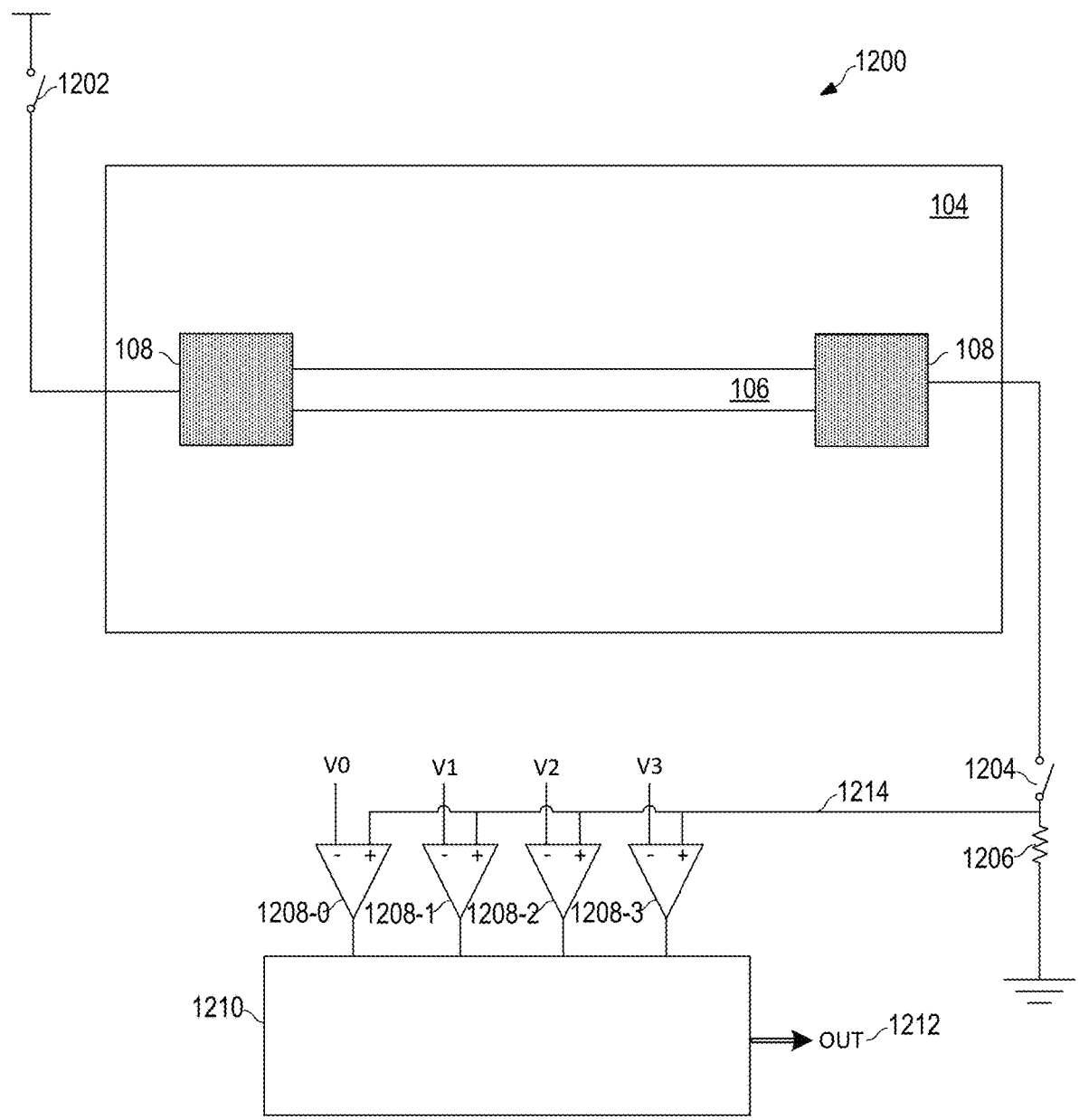
FIG. 12 is a simplified schematic diagram including an example reader.

FIG. 12 is a simplified schematic diagram of an example reader 1200. A connection to a current source, e.g., $V_{DD}$, provides a current or potential to direct a current through the polycrystalline silicon resistor 106. When switch 1202 and switch 1204 are closed, polycrystalline silicon resistor 106 and resistor 1206 are a voltage divider. The higher the resistance of polycrystalline silicon resistor 106, the lower the voltage is that is applied to comparator 1208-0, comparator 1208-1, comparator 1208-2, and comparator 1208-3. The other input to comparator 1208-0, comparator 1208-1, comparator 1208-2, and comparator 1208-3 are connected to reference voltage V0, reference voltage V1, reference voltage V2, and reference voltage V3, respectively. The output of comparator 1208-0, comparator 1208-1, comparator 1208-2, and comparator 1208-3 is applied to decoder 1210, which provides a digital output on output terminal 1212.

For example, if reference voltage V0 corresponds to state A (FIG. 9), reference voltage V1 corresponds to state B, reference voltage V2 corresponds to state C, and reference voltage V3 corresponds to state D, the reference voltage V0 will be lower than reference voltage V1, reference voltage V1 will be lower than reference voltage V2, and reference voltage V2 will be lower than reference voltage V3. Assume polycrystalline silicon resistor 106 is programmed to state C. The voltage at node 1214 will be greater than reference voltage V0, reference voltage V1, and reference voltage V2, but lower than reference voltage V3. Thus, comparator 1208-0, comparator 1208-1, and comparator 1208-2 will output zero and comparator 1208-3 will output 1. Decoder 1210 ascertains the programed state of polycrystalline silicon resistor 106 from this data to provide the appropriate output on output terminal 1212.

Figure 13:
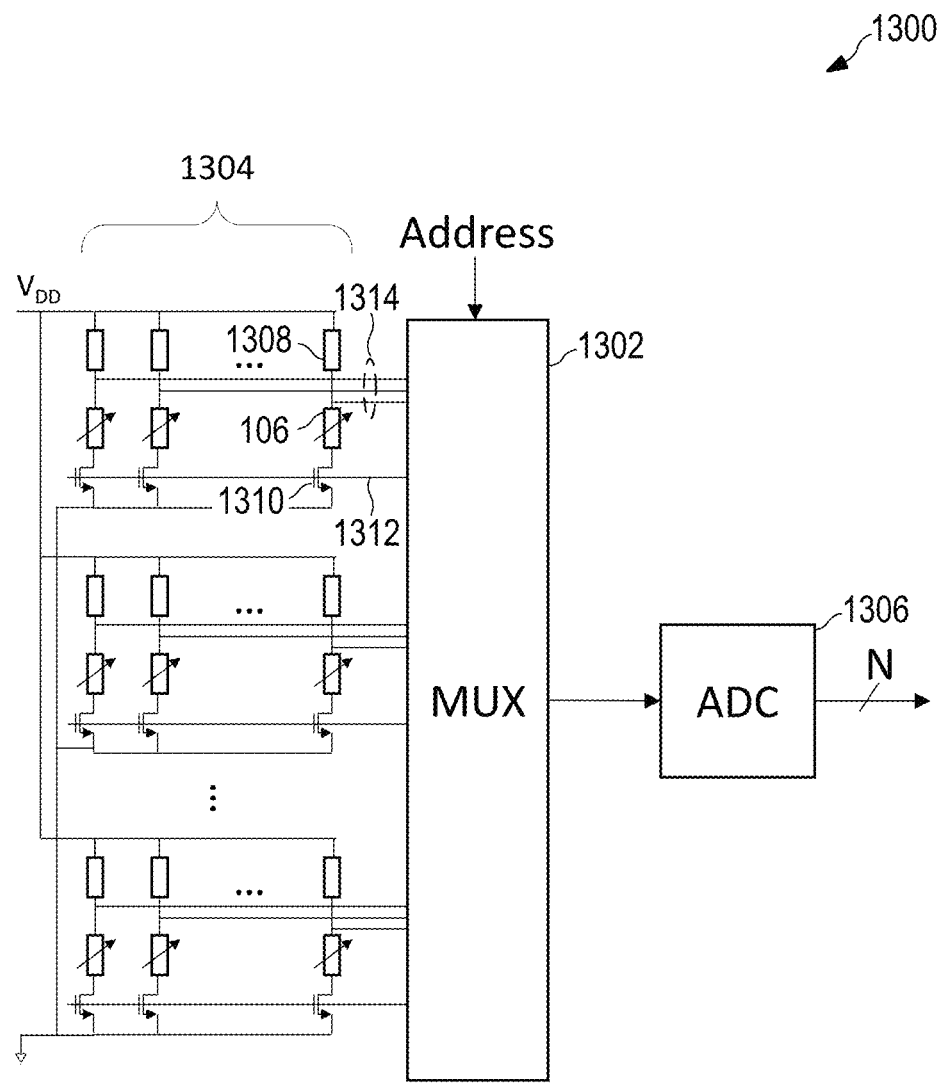
FIG. 13 is a schematic diagram of a memory.

FIG. 13 is a schematic diagram of a memory 1300. In this example, memory array 1304 is a matrix of cells (memory storage locations) where each cell includes a pull-up resistor 1308 and a corresponding polycrystalline silicon resistor 106 connected in series to provide a memory storage location. The polycrystalline silicon resistors 106 are nominally identical, e.g. have a same size, and are programmed to a programed state such as A, B, C, or D, and thus the cells programed to one of these states form a proper subset of the memory array 1304. Herein, the term "nominally identical" means that the polycrystalline silicon resistors 106 have a same design length, width and thickness, while allowing for manufacturing variability, e.g., ±5%. A "proper subset" is a set that is a subset of a larger set, but not equal to the larger set. Each of the pull-up resistors 1308 has a fixed resistance to provide a reference resistor. To read a particular cell, a high voltage (near $V_{DD}$) is applied to one of row lines 1312 corresponding to an address input into analog multiplexor 1302. This causes all of pull-down transistors 1310 on that row to be conductive, thus completing a voltage divider running from the high voltage node $V_{DD}$ through pull-up resistor 1308, through polycrystalline silicon resistor 106, through pull-down transistor 1310 to a low voltage node of ground or $V_{SS}$. The column lead 1314 for the cell that is desired to be read (as indicated by the address input to analog multiplexor 1302) is activated such that the voltage representative of the programmed state between the pull-up resistor 1308 and the polycrystalline silicon resistor 106 is directed by analog multiplexor 1302 to analog-to-digital converter (ADC) 1306. All of pull-up resistors 1308 have the same resistance value. Therefore, the voltage passed by analog multiplexor 1302 is dependent on and proportional to the resistance (i.e., the programmed value) of polycrystalline silicon resistor 106. This voltage is converted to a digital value by ADC 1306 and provided to a processor (not shown) which determines the value stored on polycrystalline silicon resistor 106 based on the digital value, which is the digital representation of the voltage passed by analog multiplexor 1302.

Modifications are possible in the described examples, and other examples are possible, within the scope of the claims.

What is claimed is:

1. An integrated circuit comprising:
a plurality of nominally identical polycrystalline silicon resistors over a semiconductor substrate, each polycrystalline silicon resistor having a resistor body with a first end and a second end, the first end connected to a current source and the second end connected to a resistance discriminator,
wherein a first proper subset of the polycrystalline silicon resistors have a first resistance, and a second first proper subset of the polycrystalline silicon resistors have a different second resistance.

2. The integrated circuit of claim 1, wherein the polycrystalline silicon in the resistor body has a median grain size, and the resistor body has a width at least 2.5 times greater than the median grain size.

3. The integrated circuit of claim 1, wherein the second resistance differs from the first resistance by at least 25%.

4. The integrated circuit of claim 1, wherein the polycrystalline silicon is doped with boron with a concentration of about $1 \times 10^{20}$ cm$^{-3}$.

5. The integrated circuit of claim 1, wherein the body is on an insulating layer that is on the substrate.

6. The integrated circuit of claim 1, wherein the polycrystalline silicon resistors in the first proper subset have a first median polysilicon grain size and the polycrystalline silicon resistors in the second proper subset have a different second median polysilicon grain size.

7. The integrated circuit of claim 1, wherein the resistance discriminator is configured to convert the first resistance to a first digital value and to convert the second resistance to a different second digital value.

8. An integrated circuit, comprising:
a memory array over a semiconductor substrate including a plurality of memory storage locations; and
a corresponding polycrystalline silicon resistor in each memory storage location, a first proper subset of the polycrystalline silicon resistors having a resistance in a first resistance range, a second proper subset of the polycrystalline silicon resistors having a resistance in a second resistance range less than the first resistance range and a third proper subset of the polycrystalline silicon resistors having a resistance in a third resistance range less than the second resistance range, the first, second and third resistance ranges being non-overlapping.

9. The integrated circuit of claim 8, further comprising an analog-to-digital (A/D) converter configured to convert a voltage proportional to the resistance of polycrystalline silicon resistors to a digital value.

10. The integrated circuit of claim 9, further comprising an analog multiplexor configured to selectively direct a selected one of the voltages to the A/D converter.

11. The integrated circuit of claim 8, wherein the polycrystalline silicon resistors in the second subset have a larger median grain size than the polycrystalline silicon resistors in the first subset, and the polycrystalline silicon resistors in the third subset have a larger median grain size than the polycrystalline silicon resistors in the second subset.

12. The integrated circuit of claim 8, wherein the polycrystalline silicon resistors in the second subset have a greater concentration of dopants at grain boundaries than do the polycrystalline silicon resistors in the first subset, and the polycrystalline silicon resistors in the third subset have a greater concentration of dopants at grain boundaries than do the polycrystalline silicon resistors in the second subset.

13. A method of forming an integrated circuit, comprising:
   forming a plurality of polycrystalline silicon resistors over a semiconductor substrate;
   passing a non-rupture first current through each resistor of a first proper subset of the polycrystalline silicon resistors thereby decreasing the resistance of the resistors in the first proper subset by a first delta resistance; and
   passing a non-rupture second current through each resistor of a second proper subset of the polycrystalline silicon resistors thereby decreasing the resistance of the resistors in the second proper subset by a greater second delta resistance.

14. The method of claim 13, wherein each of the polycrystalline silicon resistors is connected in series with a reference resistor between a first voltage node and a second voltage node.

15. The method of claim 13, further comprising forming a multiplexor configured to direct a voltage representative of a selected one of the polycrystalline silicon resistors to an analog-to-digital converter.

16. The method of claim 13, wherein the polycrystalline silicon resistors have a same nominal size.

17. The method of claim 13, wherein the polycrystalline silicon resistors in the second proper subset have a median grain size greater than a median grain size of the polycrystalline silicon resistors in the first proper subset.

18. The method of claim 13, wherein the polycrystalline silicon resistors in the second proper subset have greater dopant concentration at grain boundaries than do the polycrystalline silicon resistors in the first proper subset.

* * * * *